(12) United States Patent
Yang et al.

(10) Patent No.: US 11,749,155 B2
(45) Date of Patent: Sep. 5, 2023

(54) SHIFT REGISTER AND DRIVING METHOD THEREOF, GATE DRIVING CIRCUIT

(71) Applicants: Hefei Xinsheng Optoelectronics Technology Co., Ltd., Anhui (CN); BOE Technology Group Co., Ltd., Beijing (CN)

(72) Inventors: Tong Yang, Beijing (CN); Tingting Zhao, Beijing (CN); Xianjie Shao, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 255 days.

(21) Appl. No.: 17/311,357

(22) PCT Filed: Dec. 29, 2020

(86) PCT No.: PCT/CN2020/140680
§ 371 (c)(1),
(2) Date: Jun. 7, 2021

(87) PCT Pub. No.: WO2021/190038
PCT Pub. Date: Sep. 30, 2021

(65) Prior Publication Data
US 2022/0327973 A1    Oct. 13, 2022

(30) Foreign Application Priority Data
Mar. 24, 2020    (CN) .......................... 202010215034.8

(51) Int. Cl.
*G11C 19/28*    (2006.01)
*G09G 3/20*    (2006.01)

(52) U.S. Cl.
CPC ............... *G09G 3/20* (2013.01); *G11C 19/28* (2013.01); *G09G 2310/0267* (2013.01); *G09G 2310/0286* (2013.01)

(58) Field of Classification Search
CPC ............. G09G 3/20; G09G 2310/0267; G09G 2310/0286; G09G 3/3677;
(Continued)

(56) References Cited

U.S. PATENT DOCUMENTS

| 2010/0177023 A1 | 7/2010 | Han |
| 2015/0015562 A1 | 1/2015 | Han et al. |

(Continued)

FOREIGN PATENT DOCUMENTS

| CN | 104732946 A | 6/2015 |
| CN | 104732951 A | 6/2015 |

(Continued)

OTHER PUBLICATIONS

International Search Report for PCT/CN2020/140680 dated Mar. 26, 2021.
(Continued)

*Primary Examiner* — Pegeman Karimi
(74) *Attorney, Agent, or Firm* — Ling Wu; Stephen Yang; Ling and Yang Intellectual Property

(57) ABSTRACT

Provided are a shift register, a driving method thereof, and a gate driving circuit. The shift register includes an input sub-circuit, a first reset sub-circuit, an output sub-circuit, a pull-down sub-circuit, a pull-down control sub-circuit, and a second reset sub-circuit. The input sub-circuit provides a signal of the first voltage source to the pull-up node and the first node under the control of the signal input terminal; the first reset sub-circuit provides a signal of the second voltage source to the pull-up node and the first node under the control of the reset terminal; the output sub-circuit outputs
(Continued)

the signal of the clock signal terminal to the signal output terminal according to the level of the pull-up node.

11 Claims, 7 Drawing Sheets

(58) Field of Classification Search
CPC ....... G09G 2310/0264; G09G 2310/02; G09G 2310/00; G09G 2310/0289; G09G 2320/00; G11C 19/28
See application file for complete search history.

(56) References Cited

U.S. PATENT DOCUMENTS

| | | | |
|---|---|---|---|
| 2017/0061913 A1 | 3/2017 | Wang et al. | |
| 2018/0108290 A1* | 4/2018 | Chen | G11C 19/28 |
| 2018/0218660 A1* | 8/2018 | Wang | G09G 3/3677 |
| 2018/0286302 A1 | 10/2018 | Feng | |
| 2019/0096308 A1* | 3/2019 | Lv | G11C 19/28 |
| 2019/0139475 A1 | 5/2019 | Wang et al. | |
| 2019/0304559 A1* | 10/2019 | Wang | G09G 3/20 |
| 2019/0392916 A1* | 12/2019 | Gu | G09G 3/20 |
| 2020/0020410 A1* | 1/2020 | Du | G11C 19/28 |
| 2020/0357352 A1 | 11/2020 | Du et al. | |
| 2021/0333973 A1 | 10/2021 | Su | |

FOREIGN PATENT DOCUMENTS

| | | |
|---|---|---|
| CN | 106898287 A | 6/2017 |
| CN | 106920519 A | 7/2017 |
| CN | 107039017 A | 8/2017 |
| CN | 107657983 A | 2/2018 |
| CN | 108520724 A | 9/2018 |
| CN | 108597437 A | 9/2018 |
| CN | 108648714 A | 10/2018 |
| CN | 109064964 A | 12/2018 |
| CN | 111243489 A | 6/2020 |
| KR | 102066083 B1 | 1/2020 |

OTHER PUBLICATIONS

Office Action dated Feb. 9, 2021 for Chinese Patent Application No. 202010215034.8 and English Translation.
Office Action dated Nov. 9, 2021 for Chinese Patent Application No. 202010215034.8 and English Translation.

\* cited by examiner

During forward scan: providing, by the input sub-circuit, the signal of the first voltage source to the pull-up node and the first node under the control of the signal input terminal; pulling down, by the pull-down control sub-circuit, the level of the pull-down node according to the level of the pull-up node; outputting, by the pull-down sub-circuit, the level of the fourth voltage source to the pull-down node according to the level of the first node ~ 100

Outputting, by the output sub-circuit, the signal from the clock signal terminal to the signal output terminal according to the level of the pull-up node ~ 200

Providing, by the first reset sub-circuit, the signal of the second voltage source to the pull-up node and the first node respectively under the control of the reset terminal; pulling up, by the pull-down control sub-circuit, the level of the pull-down node according to the signal of the third voltage source; and outputting, by the pull-down sub-circuit, the level of the fourth voltage source to the pull-up node and the signal output terminal according to the level of the pull-down node ~ 300

FIG. 11

During reverse scan: providing, by the first reset sub-circuit, the signal of the second voltage source to the pull-up node and the first node respectively under the control of the reset terminal; pulling down, by the pull-down control sub-circuit, the level of the pull-down node according to the level of the pull-up node; and outputting, by the pull-down sub-circuit, the level of the fourth voltage source to the pull-down node according to the level of the first node ~ 400

Outputting, by the output sub-circuit, the signal from the clock signal terminal to the signal output terminal according to the level of the pull-up node ~ 500

Providing, by the input sub-circuit, the signal of the first voltage source to the pull-up node and the first node under the control of the input terminal; pulling up, by the pull-down control sub-circuit, the level of the pull-down node according to the signal of the third voltage source; and outputting, by the pull-down sub-circuit, the level of the fourth voltage source to the pull-up node and the signal output terminal according to the level of the pull-down node ~ 600

FIG. 12

SHIFT REGISTER AND DRIVING METHOD THEREOF, GATE DRIVING CIRCUIT

The present application claims the priority of Chinese Patent Application No. 202010215034.8 filed to the CNIPA on Mar. 24, 2020, entitled "Shift register and driving method thereof, gate driving circuit", the content of which is incorporated herein by reference.

TECHNICAL FIELD

Embodiments of the present disclosure relate to, but are not limited to, the technical field of display, in particular to a shift register, a driving method thereof and a gate driving circuit.

BACKGROUND

In order to simplify a structure of a display panel, gate lines may be driven by a Gate Driver on Array (GOA) circuit formed on an array substrate. A gate driving circuit includes multiple cascaded shift registers. Each shift register drives a gate line. One shift register may trigger other shift registers to work when outputting a turn-on signal. Thus, it is possible to drive all gate lines with several simple control signals.

However, the GOA circuit has a problem that a pull-up node (PU) and a pull-down node (PD) compete with each other (that is, influence each other), which causes poor stability of GOA driving and affects the display quality of the display panel.

SUMMARY

The following is a summary of subject matter described in detail herein. This summary is not intended to limit the protection scope of the claims.

An embodiment of the disclosure provides a shift register, which includes an input sub-circuit, a first reset sub-circuit, an output sub-circuit, a pull-down sub-circuit, a pull-down control sub-circuit and a second reset sub-circuit. The input sub-circuit is configured to provide a signal of a first voltage source to a pull-up node and a first node respectively under the control of a signal input terminal. The first reset sub-circuit is configured to provide a signal of a second voltage source to the pull-up node and the first node respectively under the control of a reset terminal. The output sub-circuit is configured to output a signal of a clock signal terminal to a signal output terminal according to a level of the pull-up node. The pull-down control sub-circuit is configured to control a level of the pull-down node according to the level of the pull-up node and a signal of a third voltage source. The pull-down sub-circuit is configured to output a level of a fourth voltage source to the pull-down node according to a level of the first node, and output the level of the fourth voltage source to the pull-up node and the signal output terminal according to the level of the pull-down node. The second reset sub-circuit is configured to reset the pull-up node and the signal output terminal under the control of a total reset terminal.

In an exemplary embodiment, the input sub-circuit includes a first transistor and a second transistor. A control electrode of the first transistor is connected with the signal input terminal. A first electrode of the first transistor is connected with the first voltage source, and a second electrode of the first transistor is connected with the pull-up node. A control electrode of the second transistor is connected with the signal input terminal. A first electrode of the second transistor is connected with the first voltage source, and a second electrode of the second transistor is connected with the first node.

In an exemplary embodiment, the first reset sub-circuit includes a third transistor and a fourth transistor. A control electrode of the third transistor is connected with the reset terminal. A first electrode of the third transistor is connected with the second voltage source, and a second electrode of the third transistor is connected with the pull-up node. A control electrode of the fourth transistor is connected with the reset terminal. A first electrode of the fourth transistor is connected with the second voltage source, and a second electrode of the fourth transistor is connected with the first node.

In an exemplary embodiment, the pull-down sub-circuit includes a fifth transistor, a six transistor and a seventh transistor. A control electrode of the fifth transistor is connected with the first node. A first electrode of the fifth transistor is connected with the fourth voltage source, and a second electrode of the fifth transistor is connected with the pull-up node. A control electrode of the sixth transistor is connected with the pull-down node. A first electrode of the sixth transistor is connected with the fourth voltage source, and a second electrode of the sixth transistor is connected with the pull-up node. A control electrode of the seventh transistor is connected with the pull-down node. A first electrode of the seventh transistor is connected with the fourth voltage source. A second electrode of the seventh transistor is connected with the signal output terminal.

In an exemplary embodiment, the pull-down control sub-circuit includes an eighth transistor, a ninth transistor, a tenth transistor and an eleventh transistor. A control electrode and A first electrode of the eighth transistor both are connected with the third voltage source. A second electrode of the eighth transistor is connected with the second node. A control electrode of the ninth transistor is connected with the second node. A first electrode of the ninth transistor is connected with the third voltage source, and a second electrode of the ninth transistor is connected with the pull-down node. A control electrode of the tenth transistor is connected with the pull-up node. A first electrode of the tenth transistor is connected with the second node and a second electrode of the tenth transistor is connected with the fourth voltage source. A control electrode of the eleventh transistor is connected with the pull-up node. A first electrode of the eleventh transistor is connected with the pull-down node and A second electrode of the eleventh transistor is connected with the fourth voltage source.

In an exemplary embodiment, the output sub-circuit includes a twelfth transistor and a capacitor. A control electrode of the twelfth transistor is connected with the pull-up node. A first electrode of the twelfth transistor is connected with the clock signal terminal, and a second electrode of the twelfth transistor is connected with the signal output terminal. One terminal of the capacitor is connected with the pull-up node, and the other terminal of the capacitor is connected with the signal output signal.

In an exemplary embodiment, the second reset sub-circuit includes a thirteenth transistor and a fourteenth transistor. A control electrode of the thirteenth transistor is connected with the total reset terminal. A first electrode of the thirteenth transistor is connected with the fourth voltage source, and the second electrode of the thirteenth transistor is connected with the signal output terminal. A control electrode of the fourteenth transistor is connected with the total reset terminal. A first electrode of the fourteenth transistor is connected with the fourth voltage source, and a second electrode of the fourteenth transistor is connected with the pull-up node.

In an exemplary embodiment, the input sub-circuit include: a first transistor and a second transistor. The first reset sub-circuit includes a third transistor and a fourth transistor. The pull-down sub-circuit includes a fifth transistor, a sixth transistor, and a seventh transistor. The pull-down control sub-circuit includes an eighth transistor, a ninth transistor, a tenth transistor and an eleventh transistor. The output sub-circuit includes a twelfth transistor and a capacitor. The second reset sub-circuit includes a thirteenth transistor and a fourteenth transistor. A control electrode of the first transistor is connected with the signal input terminal. A first electrode of the first transistor is connected with the first voltage source, and a second electrode of the first transistor is connected with the pull-up node. A control electrode of the second transistor is connected with the signal input terminal. A first electrode of the second transistor is connected with the first voltage source, and a second electrode of the second transistor is connected with the first node. A control electrode of the third transistor is connected with the reset terminal. A first electrode of the third transistor is connected with the second voltage source, and a second electrode of the third transistor is connected with the pull-up node. A control electrode of the fourth transistor is connected with reset terminal. A first electrode of the fourth transistor is connected with the second voltage source, and a second electrode of the fourth transistor is connected with the first node. A control electrode of the fifth transistor is connected with the first node. A first electrode of the fifth transistor is connected with the fourth voltage source, and a second electrode of the fifth transistor is connected with the pull-down node. A control electrode of the sixth transistor is connected with the pull-down node. A first electrode of the sixth transistor is connected with the fourth voltage source, and a second electrode of the sixth transistor is connected with the pull-up node. A control electrode of the seventh transistor is connected with the pull-down node. A first electrode of the seventh transistor is connected with the fourth voltage source, and second electrode of the seventh transistor is connected with the signal output signal. A control electrode and the first electrode of the eighth transistor both are connected with the third voltage source, and a second electrode of the eighth transistor is connected with the second node. A control electrode of the ninth transistor is connected with the second node. A first electrode of the ninth transistor is connected with the third voltage source, and a second electrode of the ninth transistor is connected with pull-down node. A control electrode of the tenth transistor is connected with the pull-up node. A first electrode of the tenth transistor is connected with the second node, and A second electrode of the tenth transistor is connected with the fourth voltage source. A control electrode of the eleventh transistor is connected with the pull-up node. A first electrode of the eleventh transistor is connected with the pull-down node, and a second electrode of the eleventh transistor is connected with the fourth voltage source. A control electrode of the twelfth transistor is connected with the pull-up node. A first electrode of the twelfth transistor is connected with clock signal terminal, and a second electrode of the twelfth transistor is connected with signal output terminal. One terminal of the capacitor is connected with the pull-up node, and the other terminal of the capacitor is connected with the signal output terminal. A control electrode of the thirteenth transistor is connected with the total reset terminal. A first electrode of the thirteenth transistor is connected with the fourth voltage source, and the second electrode of the thirteenth transistor is connected with the signal output terminal. A control electrode of the fourteenth transistor is connected with the total reset terminal. A first electrode of the fourteenth transistor is connected with the fourth voltage source, and a second electrode of the fourteenth transistor is connected with the pull-up node.

An embodiment of the present disclosure further provides a gate driving circuit including multiple cascaded shift registers as described above.

An embodiment of the present disclosure further provides a driving method for the shift register which is applied to the shift register as described above. During a forward scan, the driving method comprising: providing, by the input sub-circuit, under the control of the signal input terminal, the signal of the first voltage source to the pull-up node and the first node; pulling down, by the pull-down control sub-circuit, according to the level of the pull-up node, the level of the pull-down node; outputting, by the pull-down sub-circuit, according to the level of the first node, the level of the fourth voltage source to the pull-down node; outputting, by the output sub-circuit, according to the level of the pull-up node, the signal of the clock signal terminal to the signal output terminal; and providing, by the first reset sub-circuit, under the control of the reset terminal, the signal of the second voltage source to the pull-up node and the first node respectively; pulling up, by the pull-down control sub-circuit, according to the signal of the third voltage source, the level of the pull-down node; outputting, by the pull-down sub-circuit, according to the level of the pull-down node, the level of the fourth voltage source to the pull-up node and the signal output terminal.

In an exemplary embodiment, during a reverse scan, the driving method includes: providing, by the first reset sub-circuit, under the control of the reset terminal, the signal of the second voltage source to the pull-up node and the first node respectively; pulling down, by the pull-down control sub-circuit, according to the level of the pull-up node, the level of the pull-down node; outputting, by the pull-down sub-circuit, according to the level of the first node, the level of the fourth voltage source to the pull-down node; outputting, by the output sub-circuit, according to the level of the pull-up node, the signal of the clock signal terminal to the signal output terminal; and providing, by the first input sub-circuit, under the control of the input terminal, the signal of the first voltage source to the pull-up node and the first node respectively; pulling up, by the pull-down control sub-circuit, according to the signal of the third voltage source, the level of the pull-down node; outputting, by the pull-down sub-circuit, according to the level of the pull-down node, the level of the fourth voltage source to the pull-up node and the signal output terminal.

Other aspects will become apparent when the brief description of the drawings and embodiments of the present disclosure are read and understood.

BRIEF DESCRIPTION OF DRAWINGS

The accompanying drawings are used to provide an understanding of technical schemes of embodiments of the present disclosure, form a part of the specification and explain the technical schemes of the present disclosure together with the embodiments of the present disclosure, which do not constitute a limitation to the technical schemes of the embodiments of the present disclosure.

FIG. 11 is a flowchart of a method driving of shift register according to an embodiment of the present disclosure;

FIG. 12 is another flowchart of a driving method of a shift register according to an embodiment of the present disclosure.

DETAILED DESCRIPTION

To make the objects, technical schemes and advantages of the present disclosure more clear, embodiments of the present disclosure will be described in detail below with reference to the drawings. It should be pointed out that embodiments in the present disclosure and features in the embodiments may be combined with each other randomly if there is no conflict.

Unless otherwise defined, technical terms or scientific terms used in the embodiments of the present disclosure shall have the common meanings as construed by those of ordinary skills in the art to which the present disclosure pertains. The words "first", "second" and the like used in the embodiments of the present disclosure do not represent any order, quantity or importance, but are merely used to distinguish among different components. Similar words such as "including" or "comprising" mean that elements or articles preceding the words cover elements or articles listed after the words and their equivalents, and do not exclude other elements or articles.

Those skilled in the art may understand that transistors used in the embodiments of the present disclosure may be thin film transistors or field effect transistors or other devices with same characteristics. The thin film transistor used in the embodiments of the present disclosure may be an oxide semiconductor transistor. Since a source and a drain of a transistor used here are symmetrical, the source and the drain may be interchanged. In the embodiments of the present disclosure, to distinguish the two electrodes, one of two electrodes of the transistor other than the gate is referred to as the first electrode and the other electrode is referred to as the second electrode. The first electrode may be a source or a drain, and the second electrode may be a drain or a source.

Figure 1:
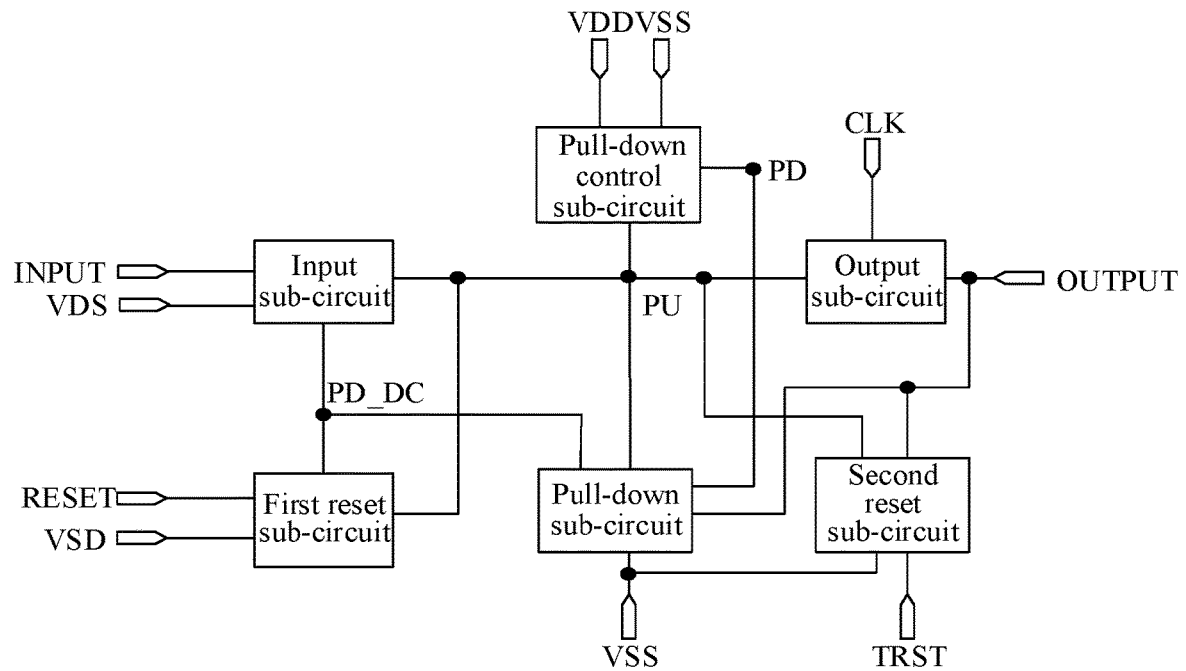
FIG. 1 is a schematic diagram of a structure of a shift register according to an embodiment of the present disclosure.

An embodiment of the present disclosure provides a shift register. FIG. 1 is a schematic diagram of a structure of a shift register according to an embodiment of the present disclosure. As illustrated in FIG. 1, the shift register according to the embodiment of the present disclosure includes an input sub-circuit, a first reset sub-circuit, an output sub-circuit, a pull-down sub-circuit, a pull-down control sub-circuit and a second reset sub-circuit.

The input sub-circuit is connected with a signal input terminal INPUT, a first voltage source VDS, a pull-up node PU and a first node PD_DC respectively and is configured to provide a signal of the first voltage source VDS to the pull-up node PU and the first node PD_DC respectively under the control of the signal input terminal INPUT.

The first reset sub-circuit is connected with a reset terminal RESET, a second voltage source VSD, the pull-up node PU and the first node PD_DC respectively and is configured to provide a signal of the second voltage source VSD to the pull-up node PU and the first node PD_DC under the control of the reset terminal RESET.

The output sub-circuit is connected with a signal output terminal OUTPUT, a clock signal terminal CLK and the pull-up node PU respectively and is configured to output a signal of the clock signal terminal CLK to the signal output terminal OUTPUT according to a level of the pull-up node PU.

The pull-down control sub-circuit is connected with the pull-up node PU, a pull-down node PD, the third voltage source VDD and the fourth voltage source VSS and is configured to control a level of the pull-down node PD according to the level of the pull-up node PU and a signal of the third voltage source VDD.

The pull-down sub-circuit is connected to the pull-up node PU, the signal output terminal OUTPUT, the pull-down node PD, the first node PD_DC and the fourth voltage source VSS and is configured to output the level of the fourth voltage source VSS to the pull-down node PD according to a level of the first node PD_DC, and to output the level of the fourth voltage source VSS to the pull-up node PU and the signal output terminal OUTPUT according to the level of the pull-down node PD.

The second reset sub-circuit is connected with a total reset terminal TRST, the fourth voltage source VSS, the pull-up node PU and the signal output terminal OUTPUT and is configured to reset the pull-up node PU and the signal output terminal OUTPUT under the control of the total reset terminal TRST.

In the shift register of the embodiment of the present disclosure, the input sub-circuit provides the signal of the first voltage source VDS to the first node PD_DC under the control of the signal input terminal INPUT. The first reset sub-circuit provides the signal of the second voltage source VSD to the first node PD_DC under the control of the reset terminal RESET. The pull-down sub-circuit outputs the level of the fourth voltage source VSS to the pull-down node PD according to the level of the first node PD_DC. Therefore, the problem that the pull-up node PU and the pull-down node PD compete with each other during dual scan is well solved, which improves the stability of GOA driving and the display quality of the display panel.

In the embodiment of the present disclosure, the total reset terminal TRST has two functions. The first function is to reset a last row of shift register units. There are no subsequent units supplying reset signals to the last row of shift register units and therefore, a total reset terminal TRST is provided to reset the last row. The second function is to reset all the rows of shift register units simultaneously while resetting the last row of shift register units to improve the stability of the circuit. The total reset signal is equivalent to an initialization signal of each frame. That is, the total reset terminal TRST pulls down the signal output terminal OUTPUT and pull-up node PU in all shift register units at the end of each frame. That is, initialization is performed for once each frame, which can improve the reliability of the shift register. The total reset terminal TRST is at a high level only when the last row of shift register units is reset. The reset terminal RESET is used for a next shift register unit to reset a previous shift register unit.

Figure 2:
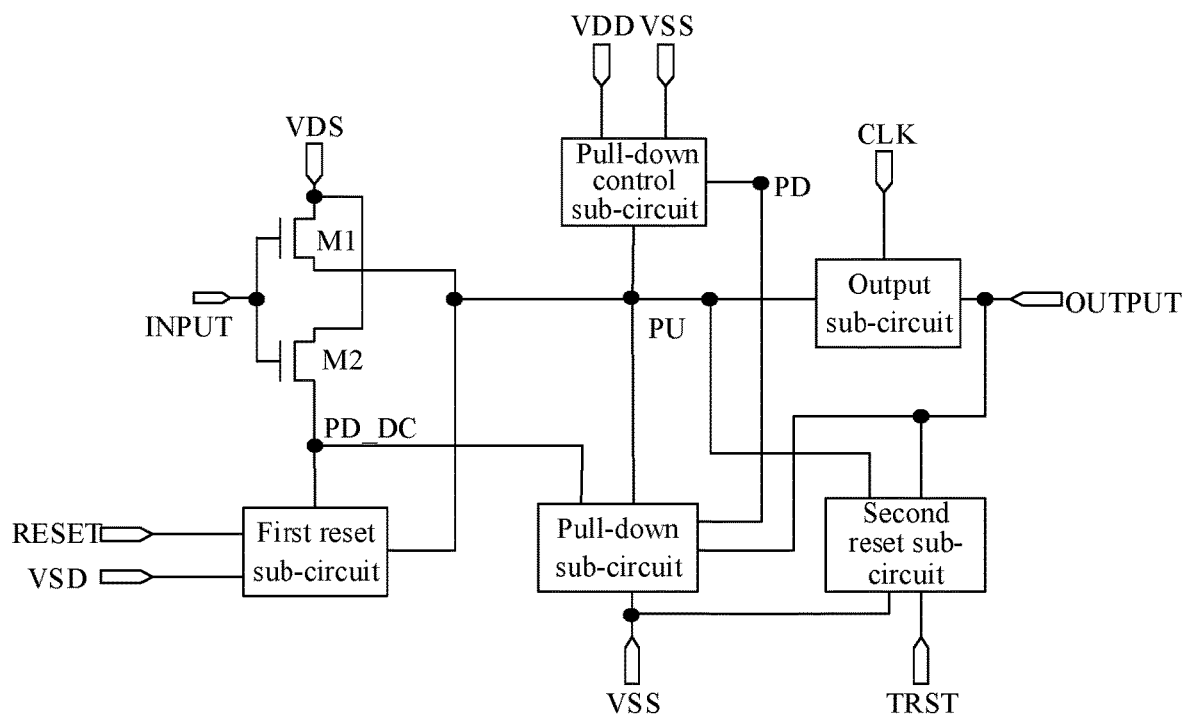
FIG. 2 is an equivalent circuit diagram of an input sub-circuit according to an embodiment of the present disclosure.

In an exemplary embodiment, FIG. 2 is an equivalent circuit diagram of an input sub-circuit according to an embodiment of the present disclosure. As illustrated in FIG. 2, the first input sub-circuit according to the embodiment of the present disclosure includes a first transistor M1 and a second transistor M2.

A control electrode of the first transistor M1 is connected with the signal input terminal INPUT. A first electrode of the first transistor M1 is connected with the first voltage source VDS, and a second electrode of the first transistor M1 is connected with the pull-up node PU. A control electrode of the second transistor M2 is connected with the signal input terminal INPUT. A first electrode of the second transistor M2 is connected with the first voltage source VDS, and a second electrode of the second transistor M2 is connected with the first node PD_DC.

FIG. 2 illustrates an exemplary structure of the input sub-circuit. Those skilled in the art should easily appreciate that implementations of the input sub-circuit are not limited to this as long as their functions can be achieved.

Figure 3:
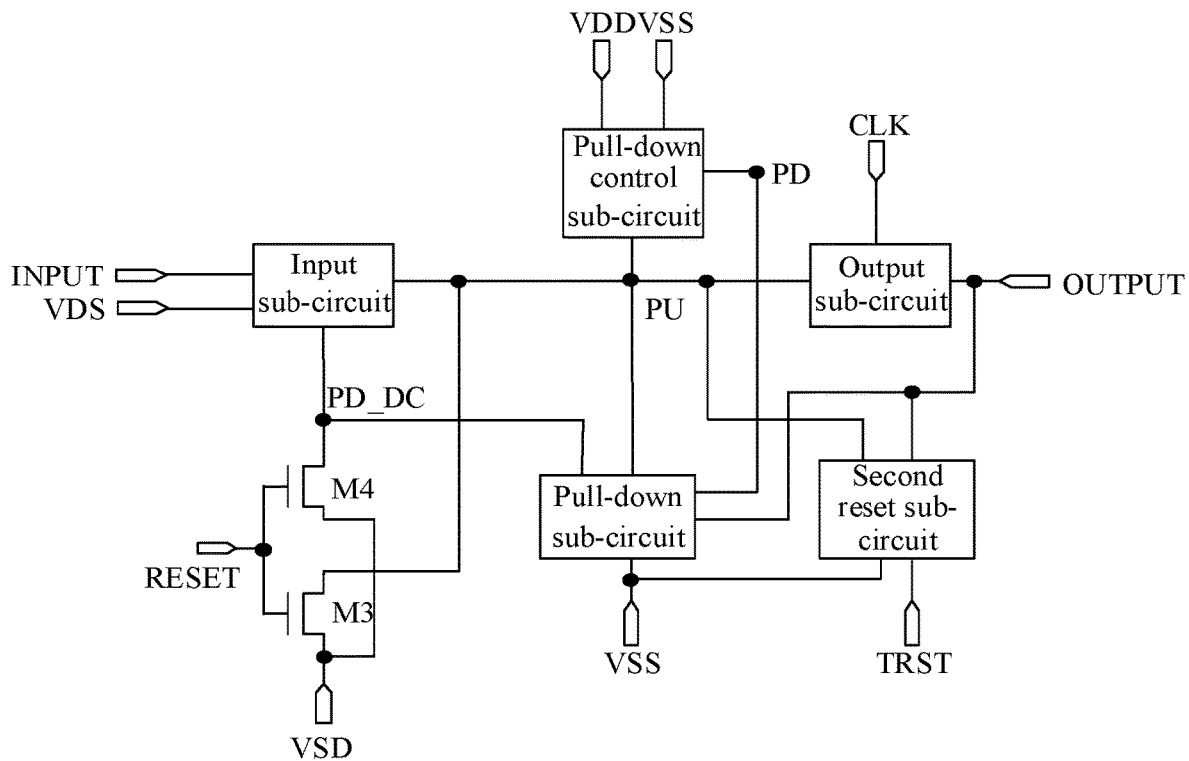
FIG. 3 is an equivalent circuit diagram of a first reset sub-circuit according to an exemplary embodiment of the present disclosure.

In an exemplary embodiment, FIG. 3 is an equivalent circuit diagram of a first reset sub-circuit according to an embodiment of the present disclosure. As illustrated in FIG. 3, the first reset sub-circuit according to the embodiment of the present disclosure includes a third transistor M3 and a fourth transistor M4.

A control electrode of the third transistor M3 is connected with a reset terminal RESET. A first electrode of the third transistor M3 is connected with a second voltage source VSD, and a second electrode of the third transistor M3 is connected with a pull-up node PU. A control electrode of the fourth transistor M4 is connected to the reset terminal RESET. A first electrode of the fourth transistor M4 is connected to the second voltage source VSD, and a second electrode of the fourth transistor M4 is connected to a first node PD_DC.

FIG. 3 illustrates an exemplary structure of the first reset sub-circuit. Those skilled in the art should easily appreciate that implementations of the input circuit are not limited to this as long as their respective functions can be achieved.

Figure 4:
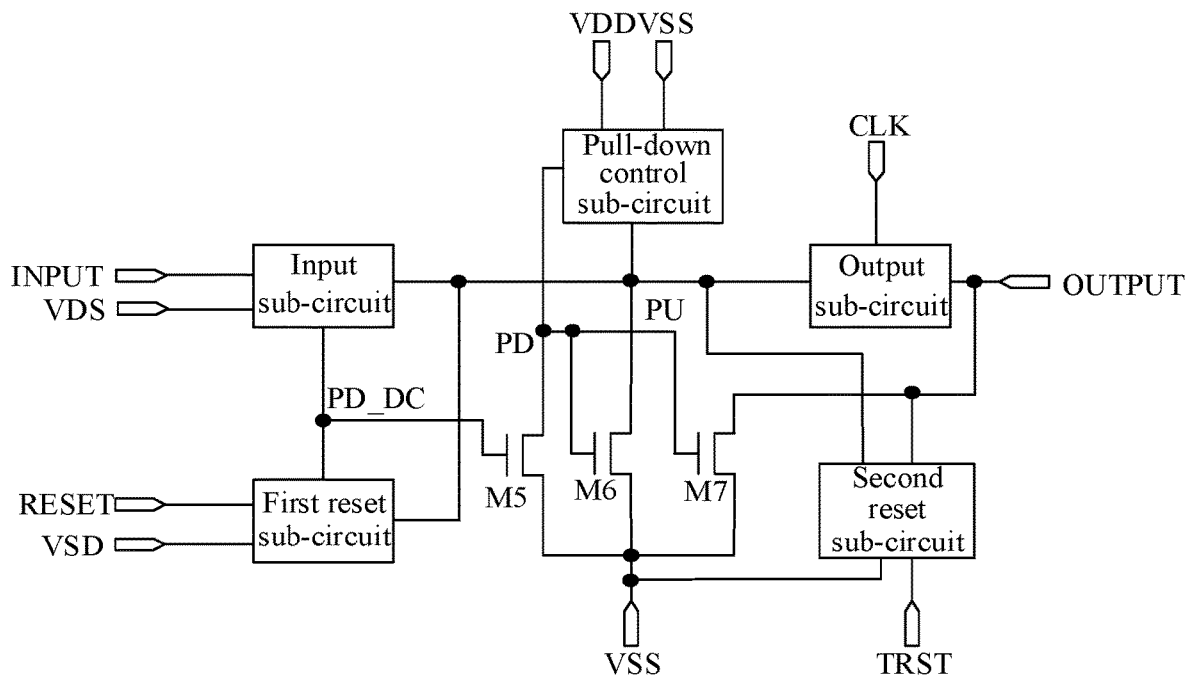
FIG. 4 is an equivalent circuit diagram of a pull-down sub-circuit according to an embodiment of the present disclosure.

In an exemplary embodiment, FIG. 4 is an equivalent circuit diagram of a pull-down sub-circuit according to an embodiment of the present disclosure. As illustrated in FIG. 4, the pull-down sub-circuit according to the embodiment of the present disclosure includes a fifth capacitor M5, a sixth transistor M6 and a seventh transistor M7.

A control electrode of the fifth transistor M5 is connected with a first node PD_DC. A first electrode of the fifth transistor M5 is connected with a fourth voltage source VSS, and a second electrode of the fifth transistor M5 is connected with a pull-down node PD. A control electrode of the sixth transistor M6 is connected with the pull-down node PD. A first electrode of the sixth transistor M6 is connected with the fourth voltage source VSS, and a second electrode of the sixth transistor M6 is connected with a pull-up node PU. A control electrode of the seventh transistor M7 is connected with the pull-down node PD. A first electrode of the seventh transistor M7 is connected with the fourth voltage source VSS, and a second electrode of the seventh transistor M7 is connected with a signal output terminal OUTPUT.

FIG. 4 illustrates an exemplary structure of the pull-down sub-circuit. Those skilled in the art should easily appreciate that implementations of the pull-down sub-circuit are not limited to this as long as their respective functions can be achieved.

Figure 5:
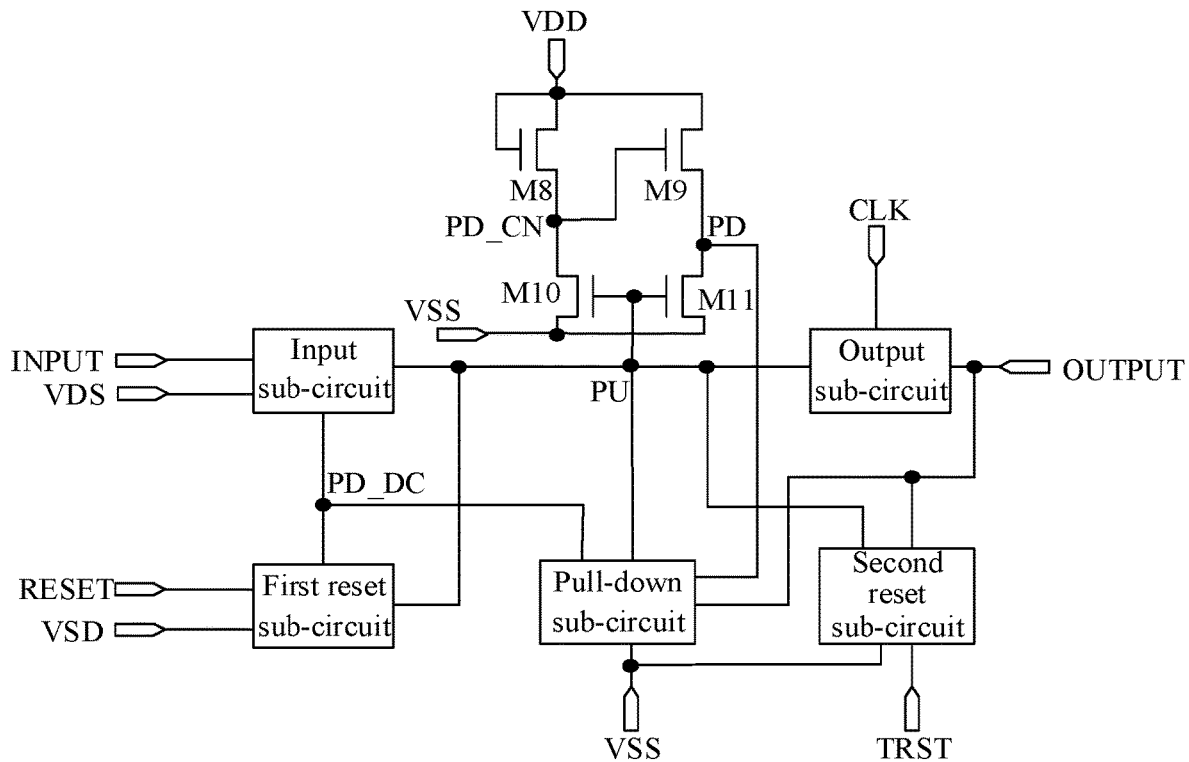
FIG. 5 is an equivalent circuit diagram of a pull-down control sub-circuit according to an embodiment of the present disclosure.

In an exemplary embodiment, FIG. 5 is an equivalent circuit diagram of a pull-down control sub-circuit according to an embodiment of the present disclosure. As illustrated in FIG. 5, the pull-down control sub-circuit according to the embodiment of the present disclosure includes an eighth transistor M8, a ninth transistor M9, a tenth transistor M10 and an eleventh transistor M11.

A control electrode and a first electrode of the eighth transistor M8 both are connected with a third voltage source VDD. A second electrode of the eighth transistor M8 is connected with a second node PD_CN. A control electrode of the ninth transistor M9 is connected with the second node PD_CN. A first electrode of the ninth transistor M9 is connected with a third voltage source VDD, and a second electrode of the ninth transistor M9 is connected with a pull-down node PD. A control electrode of the tenth transistor M10 is connected with the pull-down node PD. A first electrode of the tenth transistor M10 is connected with the second node PD_CN and A second electrode of the tenth transistor M10 is connected with the fourth voltage source VSS. A control electrode of the eleventh transistor M11 is connected with a pull-up node PU. A first electrode of the eleventh transistor M11 is connected with the pull-down node PD and a second electrode of the eleventh transistor M11 is connected with the fourth voltage source VSS.

FIG. 5 illustrates an exemplary structure of the pull-down control sub-circuit. Those skilled in the art should easily appreciate that implementations of the above various sub-circuits are not limited to this as long as their respective functions can be achieved.

Figure 6:
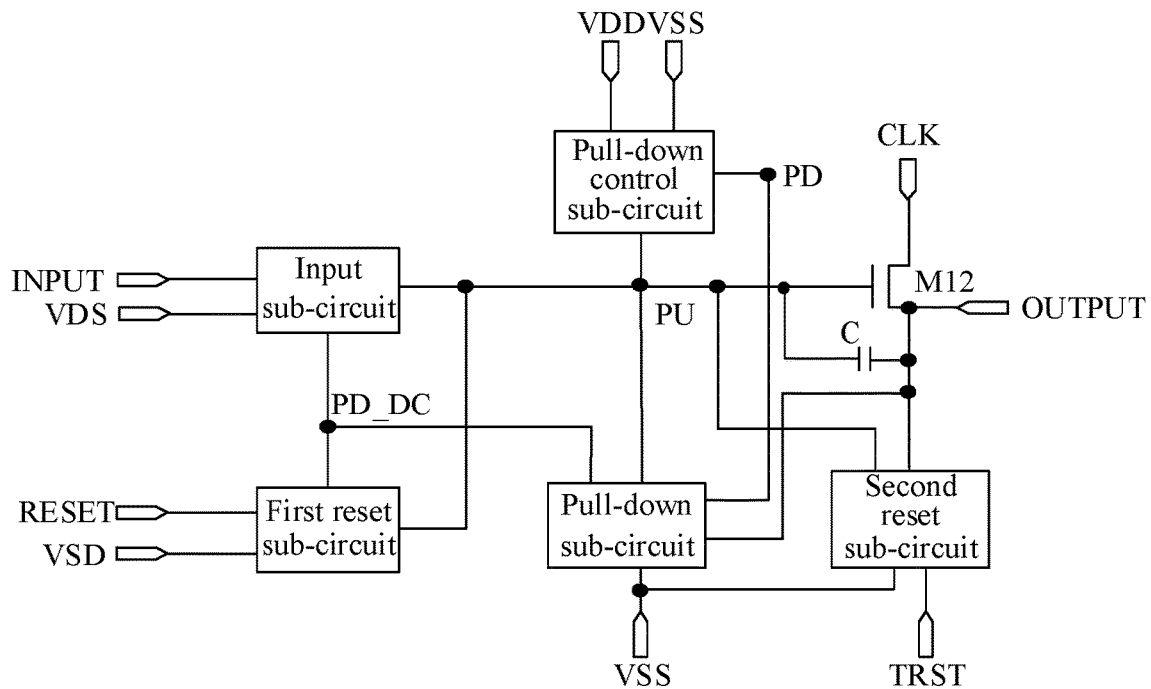
FIG. 6 is an equivalent circuit diagram of an output sub-circuit according to an embodiment of the present disclosure.

In an exemplary embodiment, FIG. 6 is an equivalent circuit diagram of an output sub-circuit according to an embodiment of the present disclosure. As illustrated in FIG. 6, the output sub-circuit according to the embodiment of the present disclosure includes a twelfth transistor M12 and a capacitor C.

A control electrode of the twelfth transistor M12 is connected with a pull-up node PU. A first electrode of the twelfth transistor M12 is connected with a clock signal terminal CLK, and a second electrode of the twelfth transistor M12 is connected with a signal output terminal OUTPUT. One terminal of the capacitor C is connected with a pull-up node PU, and the other terminal of the capacitor C is connected with the signal output terminal OUTPUT.

FIG. 6 illustrates an exemplary structure of the output sub-circuit. Those skilled in the art should easily appreciate that implementations of the output sub-circuit are not limited to this as long as their respective functions can be achieved.

Figure 7:
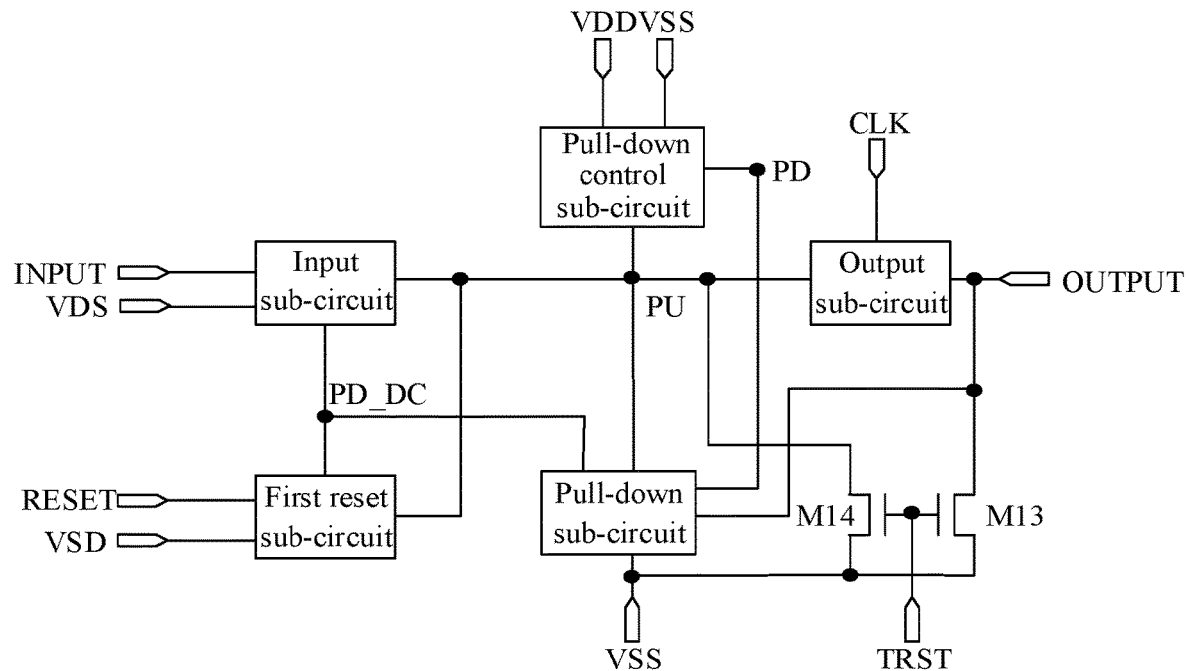
FIG. 7 is an equivalent circuit diagram of a second reset sub-circuit according to an embodiment of the present disclosure.

In an exemplary embodiment, FIG. 7 is an equivalent circuit diagram of a second reset sub-circuit according to an embodiment of the present disclosure. As illustrated in FIG. 7, the second reset sub-circuit according to the embodiment of the present disclosure includes a thirteenth transistor M13 and a fourteenth transistor M14.

A control electrode of the thirteenth transistor M13 is connected with a total reset terminal TRST. A first electrode of the thirteenth transistor M13 is connected with a fourth voltage source VSS, and a second electrode of the thirteenth transistor M13 is connected with a signal output terminal OUTPUT. A control electrode of the fourteenth transistor M14 is connected with the total reset terminal TRST. A first electrode of the fourteenth transistor M14 is connected with the fourth voltage source VSS, and a second electrode of the fourteenth transistor M14 is connected with a pull-up node PU.

FIG. 7 illustrates an exemplary structure of the second reset sub-circuit. Those skilled in the art should easily appreciate that implementations of the second reset sub-circuit are not limited to this as long as their respective functions can be achieved.

Figure 8:
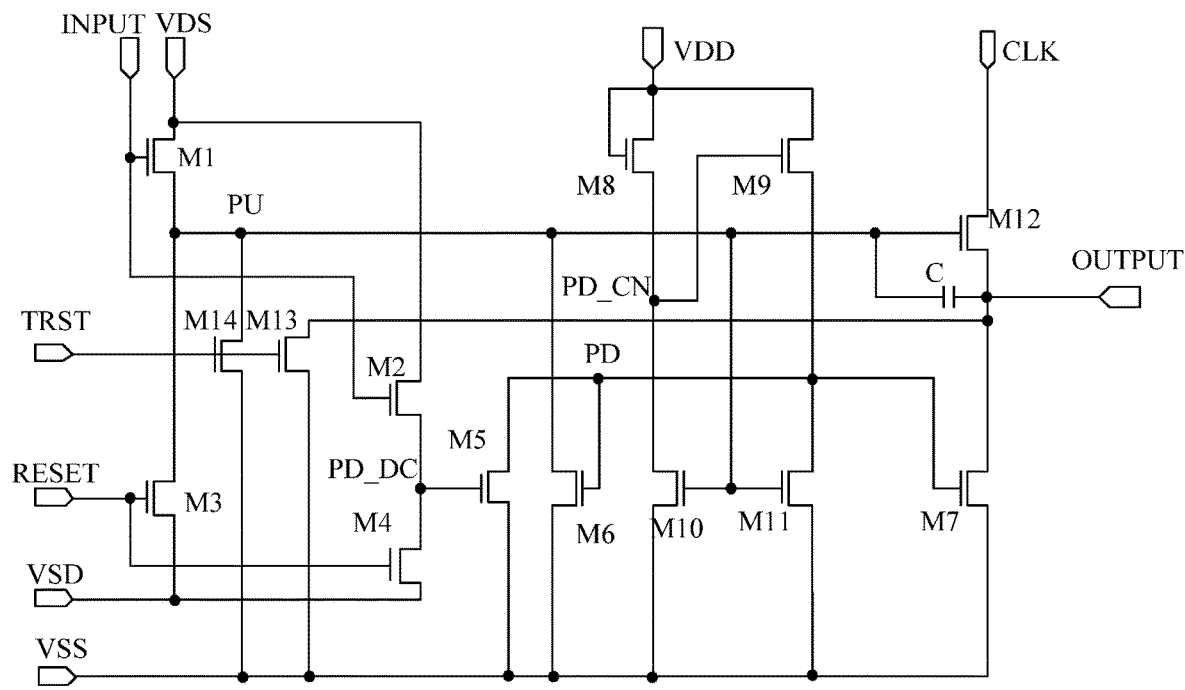
FIG. 8 is an equivalent circuit diagram of a shift register according to an embodiment of the present disclosure.

FIG. 8 is an equivalent circuit diagram of a shift register according to an embodiment of the present disclosure. As illustrated in FIG. 8, in the shift register provided by the embodiment of the present disclosure, an input sub-circuit includes: a first transistor M1 and a second transistor M2. A first reset sub-circuit includes a third transistor M3 and a fourth transistor M4. A pull-down sub-circuit includes a fifth transistor M5, a sixth transistor M6, and a seventh transistor M7. A pull-down control sub-circuit includes an eighth transistor M8, a ninth transistor M9, a tenth transistor M10 and an eleventh transistor M11. A output sub-circuit includes a twelfth transistor M12 and a capacitor C. A second reset sub-circuit includes a thirteenth transistor M13 and a fourteenth transistor M14.

A control electrode of the first transistor M1 is connected with a signal input terminal INPUT. A first electrode of the first transistor M1 is connected with a first voltage source VDS, and a second electrode of the first transistor M1 is connected with a pull-up node PU. A control electrode of the second transistor M2 is connected with the signal input terminal INPUT. A first electrode of the second transistor M2 is connected with the first voltage source VDS, and a second electrode of the second transistor M2 is connected with a first node PD_DC. A control electrode of the third transistor M3 is connected with a reset terminal RESET. A first electrode of the third transistor M3 is connected with the second voltage source VSD, and a second electrode of the third transistor M3 is connected with the pull-up node PU. A control electrode of the fourth transistor M4 is connected with reset terminal RESET. A first electrode of the fourth transistor M4 is connected with the second voltage source VSD, and a second electrode of the fourth transistor M4 is connected with the first node PD_DC. A control electrode of the fifth transistor M5 is connected with the first node PD_DC. A first electrode of the fifth transistor M5 is connected with a fourth voltage source VSS, and a second electrode of the fifth transistor M5 is connected with a pull-down node PD. A control electrode of the sixth transistor M6 is connected with the pull-down node PD. A first electrode of the sixth transistor M6 is connected with the fourth voltage source VSS, and a second electrode of the sixth transistor M6 is connected with pull-up node PU. A control electrode of the seventh transistor M7 is connected with the pull-down node PD. A first electrode of the seventh transistor M7 is connected with the fourth voltage source VSS, and a second electrode of the seventh transistor M7 is connected with the signal output terminal OUTPUT. A control electrode and a first electrode of the eighth transistor M8 both are connected with the third voltage source VDD, and a second electrode of the eighth transistor M8 is connected with the second node PD_CN. A control electrode of the ninth transistor M9 is connected with the second node PD_CN. A first electrode of the ninth transistor M9 is connected with the third voltage source VDD and a second electrode of the ninth transistor M9 is connected with pull-down node PD. A control electrode of the tenth transistor M10 is connected with the pull-up node PU. A first electrode of the tenth transistor M10 is connected with the second node PD_CN, and a second electrode of the tenth transistor M10 is connected with the fourth voltage source VSS. A control electrode of the eleventh transistor M11 is connected with the pull-up node PU. A first electrode of the eleventh transistor M11 is connected with the pull-down node PD, and a second electrode of the eleventh transistor M11 is connected with the fourth voltage source VSS. A control electrode of the twelfth transistor M12 is connected with the pull-up node PU. A first electrode of the twelfth transistor M12 is connected with clock signal terminal CLK, and a second electrode of the twelfth transistor M2 is connected with signal output terminal OUTPUT. One terminal of the capacitor C is connected with the pull-up node PU, and the other terminal of the capacitor C is connected with the signal output terminal OUTPUT. A control electrode of the thirteenth transistor M13 is connected with a total reset terminal TRST. A first electrode of the thirteenth transistor M13 is connected with the fourth voltage source VSS, and a second electrode of the thirteenth transistor M13 is connected with the signal output terminal OUTPUT. A control electrode of the fourteenth transistor M14 is connected with the total reset terminal TRST. A first electrode of the fourteenth transistor M14 is connected with the fourth voltage source VSS, and the second electrode of the fourteenth transistor M14 is connected with the pull-up node PU.

FIG. 8 illustrates the exemplary structure of the input sub-circuit, the first reset sub-circuit, the pull-down sub-circuit, the pull-down control sub-circuit, the output sub-circuit, and the second reset sub-circuit. Those skilled in the art should easily appreciate that implementations of the above various sub-circuits are not limited to this as long as their respective functions can be achieved.

In this embodiment, the transistors M1 to M14 may all be N-type thin film transistors or P-type thin film transistors, such that process flows can be unified and process manufacturing procedures can be reduced, contributing to the improvement of the yield of qualified products. As low-temperature polysilicon thin film transistor has a small leakage current, all transistors of the embodiment of the present disclosure may be low-temperature polysilicon thin film transistors with a bottom gate structure or a top gate structure, as long as a switch function can be achieved.

The capacitor C may be a liquid crystal capacitor including a pixel electrode and a common electrode, or an equivalent capacitor containing a storage capacitor and the liquid crystal capacitor including the pixel electrode and the common electrode, which is not limited in the present embodiment.

Technical schemes of the embodiments of the present disclosure will be further illustrated below by an operation process of a shift register. The following describes the working process of a first stage shift register as an example.

Figure 9:
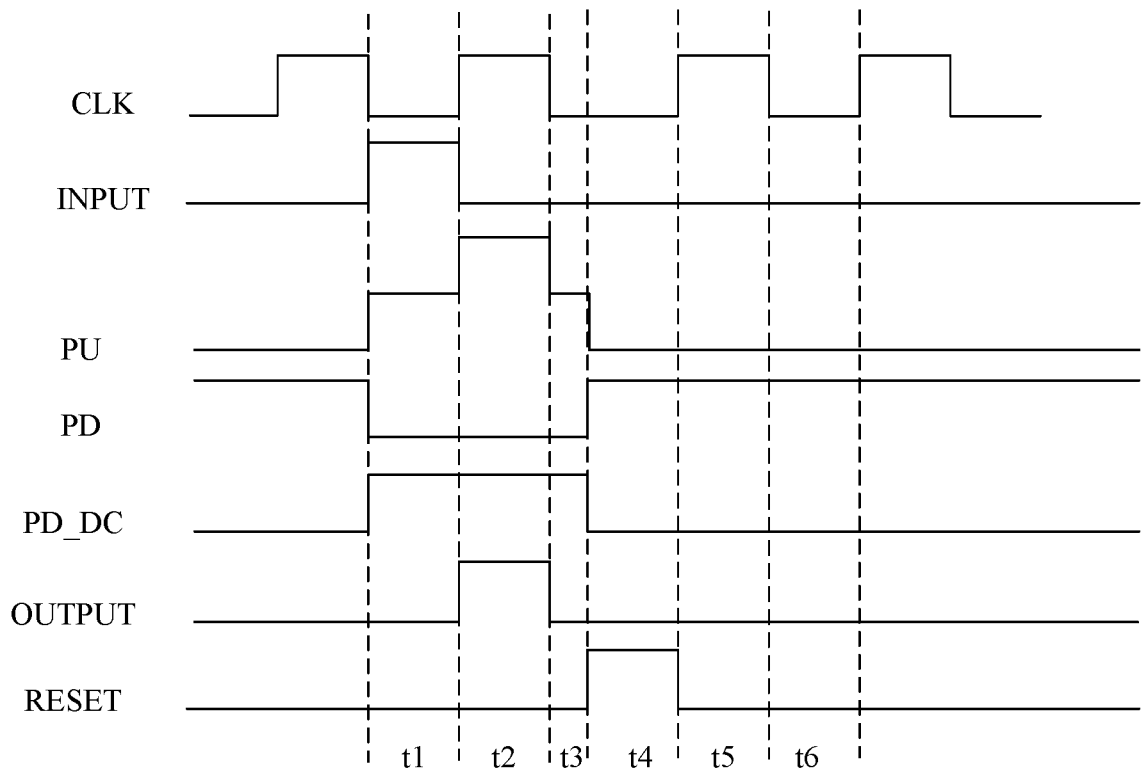
FIG. 9 is a timing diagram of an operation of a shift register during a forward scan according to an embodiment of the present disclosure.
Figure 10:
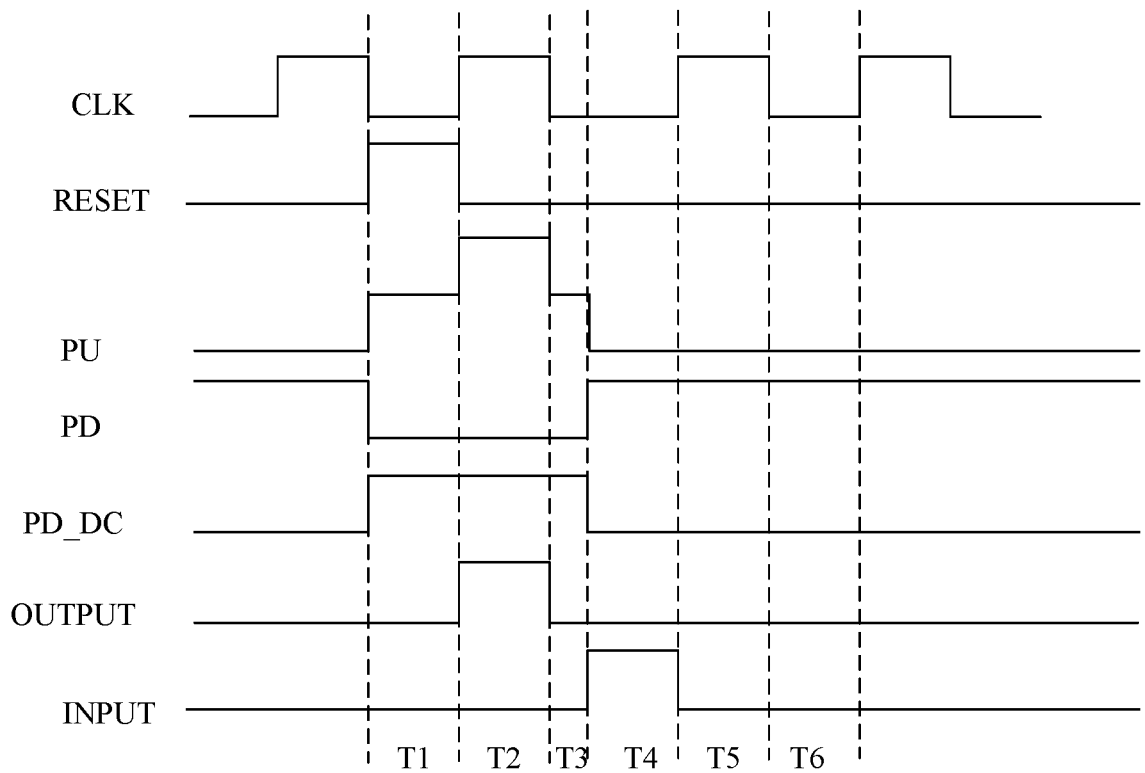
FIG. 10 is a timing diagram of an operation of a shift register during a reverse scan according to an embodiment of the present disclosure.

Taking that transistors M1-M14 in a shift register according to an embodiment of the present disclosure are N-type thin film transistors as an example. FIG. 9 is a timing diagram of an operation of a shift register during a forward scan according to an embodiment of the present disclosure; FIG. 10 is a timing diagram of an operation of a shift register during a reverse scan according to an embodiment of the present disclosure. As illustrated in FIG. 8, FIG. 9 and FIG.

10, the shift register according to the embodiment of the present disclosure includes 14 transistor units (M1-M14), one capacitor unit (C), five input terminals (INPUT RESET, CLK and TRST), one output terminal (OUTPUT) and four voltage sources (VDS, VSD, VSS and VDD). The third voltage source VDD continuously provides high-potential signals, and the fourth power terminal VSS continuously provides low-potential signals.

As illustrated in FIG. 9, the forward scan timing can be divided into six phases, t1 to t6. During the forward scan, the first voltage source VDS inputs a high-potential signal VGH, and the second voltage source VSD inputs a low-potential signal VGL.

At phase t1, a high-potential signal is input by the signal input terminal INPUT of the shift register G_n. Since an input signal via the signal input terminal INPUT of the shift register G_n is an output signal of the signal output terminal OUTPUT of a previous-stage shift register G_n−1, it can be said that a high-potential signal from the signal output terminal OUTPUT of the previous-stage shift register G_n−1 is input to the signal input terminal INPUT of the shift register G_n. Thus, the first transistor M1 and the second transistor M2 are turned on, and the first voltage source VDS charges the capacitor C via the first transistor, so that the potential of the pull-up node PU to be pulled up to a high potential. The tenth transistor M10, the eleventh transistor M11 and the twelfth transistor M12 are turned on are under the driving of the high potential of the pull-up node PU. The first node PD_DC potential is pulled up as the second transistor M2 is turned on. The fifth transistor M5 is turned on under the driving of the high potential of the first node PD_DC to discharge to the pull-down node PD. The sixth transistor M6 and the seventh transistor M7 are turned off to prevent the sixth transistor M6 from discharging to the pull-up node PU, that is, to prevent the competition between the pull-down node PD and the pull-up node PU. A low-potential signal is input via the clock signal terminal CLK, and the low-potential signal input by the clock signal terminal CLK is transmitted to the signal output terminal OUTPUT via the twelfth transistor M12.

At phase t2, a low-potential signal is input by the signal input terminal INPUT of the shift register G_n, and the first transistor M1 is turned off. However, since the capacitor C has already stored the high-potential signal input by the first voltage source VDS at phase t1, the potential of the pull-up node PU is still at a high potential. Then, as a high-potential signal is input via the clock signal terminal CLK, the voltage of the pull-up node PU is amplified due to bootstrap effect, that is, the potential of the terminal of the capacitor C connected with the pull-up node PU continues to rise on the basis of that at phase t1, and the twelfth transistor M12 maintains a turn-on state. Therefore, the high-potential signal input by the clock signal terminal CLK is transmitted to the signal output terminal OUTPUT via the twelfth transistor M12. The potential of the pull-down node PD maintains at a low potential as that at phase t1 and therefore, the sixth transistor M6 and the seventh transistor M7 maintains a turn-off state, which prevents the output signal of the signal output terminal OUTPUT from being pulled down to the potential of VGL.

At phase t3, a period during a low-potential signal is input by the signal input terminal INPUT of shift register G_n, and a low-potential signal is input by the clock signal terminal CLK may be a touch period. during this period, the pull-up node PU is at a high level and the tenth transistor M10 and the eleventh transistor M11 maintains turn-on state, so that both the second node PD_CN and the pull-down node PD are at a low level, and the seventh transistor M7 is turned off Although the twelfth transistor M12 is turned on, the output signal of the signal output terminal OUTPUT is at a low level as the clock signal CLK maintains a low level.

At phase t4, a high-potential signal is input by the reset terminal RESET of the shift register G_n and a low-potential signal is input by the clock signal terminal CLK. The high-potential signal input by the reset terminal RESET is a signal output by the signal output terminal OUTPUT of the next-stage shift register G_n+1. The third transistor M3 and the fourth transistor M4 are turned on. Therefore, the potential of the pull-up node PU connected to one terminal of the third transistor M3 is pulled down to the low potential of the second voltage source VSD, and then the tenth transistor M10 and the eleventh transistor M11 are turned off while the eighth transistor M8 and the ninth transistor M9 are turned on. The potential of the first node PD_DC is pulled up, and the potential of the first node PD_DC connected with one terminal of the fourth transistor M4 is pulled down to the low potential of the second voltage source VSD, and the fifth transistor M5 is turned off. At this time, the pull-down node PD is only connected with the second electrode of the ninth transistor M9 while the first electrode of the ninth transistor M9 is connected with the third voltage source VDD and thus, the potential of the pull-down node PD becomes a high potential.

Since a gate of the sixth transistor M6 and a gate of the seventh transistor M7 both are connected with the pull-down node PD, both the sixth transistor M6 and the seventh transistor M7 are turned on when the potential of the pull-down node PD becomes a high potential. As the sixth transistor M6 is turned on, the pull-up node PU is pulled down to a low potential VGL. The gate of the twelfth transistor M12 is connected with the pull-up node PU and thus, the twelfth transistor M12 is turned off after the potential of the pull-up node PU is lowered to the potential of VGL. As the seventh transistor M7 is turned on, the signal output terminal OUTPUT is connected with the fourth voltage source VSS, and the potential of the signal output terminal OUTPUT is reset to a low potential.

At phase t5, a high-potential signal is input by the clock signal terminal CLK. Since the pull-down node PD is at a high potential while the pull-up node PU connected with a gate of the twelfth transistor M12 is still at a low potential, the high-potential signal input by the clock signal terminal CLK will not be transmitted to the signal output terminal OUTPUT as the twelfth transistor M12 maintains a turn-off state as it is at phase t4. Since the seventh transistor M7 is still turned on, the signal output terminal OUTPUT is still connected with the fourth voltage source VSS, the signal output terminal OUTPUT continues to output the low-potential signal VGL of the phase t4, eliminating the coupling noise generated by the high-potential signal of clock signal CLK at signal output terminal OUTPUT, which ensures the stability of the signal output by signal output terminal OUTPUT.

At phase t6, a low-potential signal is input by the clock signal terminal CLK. Since the pull-down node PD is at a high potential while the pull-up node PU connected with a gate of the twelfth transistor M12 is still at a low potential, the twelfth transistor M12 maintains the turn-off state as it is at phase t4. Since the seventh transistor M7 is still turned on, the signal output terminal OUTPUT is still connected with the fourth voltage source VSS, the signal output terminal OUTPUT continues to output the low-potential signal VGL of the phase t4. After the above, phase t5 and phase t6 are repeated in sequence until the shift register according to the embodiment of the present disclosure receives the high-potential signal from the signal input terminal INPUT, and then phase t1 is re-executed.

When the last row of shift register units are reset, a high-potential signal is input by the total reset terminal TRST of the shift register G_n, and the thirteenth transistor M13 and the fourteenth transistor M14 are turned on, to pull down the potentials of the signal output terminal OUTPUT and the pull-up node PU in all shift register units in the shift register, and to reset the shift register units in all rows, which improves the stability of the circuit.

As illustrated in FIG. 10, the reverse scan timing can be divided into six phases, T1 to T6. During the reverse scan, the first voltage source VDS inputs a low-potential signal while the second voltage source VSD inputs a high-potential signal, and the reset terminal RESET is equivalent to the signal input terminal INPUT during the forward scan, the signal input terminal INPUT is equivalent to the reset terminal RESET during the forward scan.

At phase T1, a high-potential signal is input by the reset terminal RESET. Since the input signal via the reset terminal RESET of the shift register G_n is the output signal of the signal output terminal OUTPUT of the next-stage shift register G_n+1, it can be said that the high-potential signal of the signal output terminal OUTPUT of the next-stage shift register G_n+1 is input to the reset terminal RESET of the shift register G_n. Thus, the third transistor M3 and the fourth transistor M4 is turned on, and the second voltage source VSD charges the capacitor C via the third transistor M3, so that the potential of the pull-up node PU is pulled up to a high potential, and the tenth transistor M10, the eleventh transistor M11 and the twelfth transistor M12 are turned on under the driving of the high potential of the pull-up node PU. The first node PD_DC potential is pulled up as the fourth transistor M4 is turned on. The fifth transistor M5 is turned on under the driving of the high potential of the first node PD_DC to discharge to the pull-down node PD. The sixth transistor M6 and the seventh transistor M7 are turned off to prevent the sixth transistor M6 from discharging to the pull-up node PU, that is, to prevent the competition between the pull-down node PD and the pull-up node PU. A low-potential signal is input by the clock signal terminal CLK and the low-potential signal is transmitted to the signal output terminal OUTPUT via the twelfth transistor M12.

At phase T2, a low-potential signal is input by the reset terminal RESET of the shift register G_n, and the third transistor M3 is turned off. However, since the capacitor C has already stored the high-potential signal input by the second voltage source VSD in phase T1, the potential of the pull-up node PU is still a high potential. Then, as a high-potential signal is input by the clock signal terminal CLK, the voltage of the pull-up node PU is amplified due to bootstrap effect, that is, the potential of the terminal of the capacitor C connected with the pull-up node PU continues to rise on the basis of that at phase T1, and the twelfth transistor M12 maintains the turn-on state. Therefore, the high-potential signal input by the clock signal terminal CLK is transmitted to the signal output terminal OUTPUT via the twelfth transistor M12. The potential of the pull-down node PD maintains at a low potential as that at phase T1 and therefore, the sixth transistor M6 and the seventh transistor M7 maintains the turned-off state, which prevents the output signal of the signal output terminal OUTPUT from being pulled down to the potential of VGL.

At phase T3, a period during a low-potential signal is input by the reset terminal RESET of shift register G_n and the a low-potential signal is input by the clock signal terminal CLK may be a touch period. during this period, the pull-up node PU is at a high level and the tenth transistor M10 and the eleventh transistor M11 maintains the turn-on state, so that the second node PD_CN and the pull-down node PD both are at a low level. The seventh transistor M7 is turned off. Although the twelfth transistor M12 is turned on, the output signal of the signal output terminal OUTPUT is at a low level as the clock signal CLK maintains at a low level.

At phase T4, a high-potential signal is put by the signal input terminal INPUT of the shift register G_n and a low-potential signal is input by the clock signal terminal CLK. The high-potential signal input by the signal input terminal INPUT is a signal output by the signal output terminal OUTPUT of the pervious-stage shift register G_n–1. The first transistor M1 and the second transistor M2 are turned on. Therefore, the potential of the pull-up node PU connected to one terminal of the first transistor M1 is pulled down to the low potential of the first voltage source VDS, and then the tenth transistor M10 and the eleventh transistor M11 are turned off while the eighth transistor M8 and the ninth transistor M9 are turned on. The potential of the first node PD_DC connected with one terminal of the second transistor M2 is pulled down to the low potential of the first voltage source VDS. The pull-down node PD is only connected with the second electrode of the ninth transistor M9 while the first electrode of the ninth transistor M9 is connected with the third voltage source VDD and thus, the potential of the pull-down node PD becomes a high potential. Since the gate of the sixth transistor M6 and the gate of the seventh transistor M7 both are connected with the pull-down node PD, both the sixth transistor M6 and the seventh transistor M7 are turned on when the potential of the pull-down node PD becomes a high potential. As the sixth transistor M6 is turned on, the pull-up node PU is pulled down to a low potential VGL. The gate of the twelfth transistor M12 is connected with the pull-up node PU and thus, the twelfth transistor M12 is turned off after the potential of the pull-up node PU is lowered to the low potential of first voltage source VDS. As the seventh transistor M7 is turned on, the signal output terminal OUTPUT is connected with the fourth voltage source VSS, and the potential of the signal output terminal OUTPUT is reset to a low potential.

At phase T5, a high-potential signal is input by the clock signal terminal CLK. Since the pull-down node PD is at a high potential while the pull-up node PU connected with a gate of the twelfth transistor M12 is still at a low potential, the high-potential signal input by the clock signal terminal CLK will not be transmitted to the signal output terminal OUTPUT as the twelfth transistor M12 maintains the turn-off state as it is at phase T4. Since the seventh transistor M7 is still turned on, the signal output terminal OUTPUT is still connected with the fourth voltage source VSS, the signal output terminal OUTPUT continues to output the low-potential signal of the phase t4, eliminating the coupling noise generated by the high-potential signal of clock signal CLK at signal output terminal OUTPUT, which ensures the stability of the signal output by signal output terminal OUTPUT.

At phase T6, a low-potential signal is input by the clock signal terminal CLK. Since the pull-down node PD is at a high potential while the pull-up node PU connected with a gate of the twelfth transistor M12 is still at a low potential, the twelfth transistor M12 still maintains the turn-off state as it is at phase T4. Since the seventh transistor M7 is still turned on, the signal output terminal OUTPUT is still connected with the fourth voltage source VSS, the signal output terminal OUTPUT continues to output the low-potential signal of the phase T4. After the above, phase T5 and phase T6 are repeated in sequence until the shift register according to the embodiment of the present disclosure receives the high-potential signal from the reset terminal RESET, and then phase T1 is re-executed.

When the last row of shift register units are reset, a high-potential signal is input by the total reset terminal TRST of the shift register G_n, and the thirteenth transistor M13 and the fourteenth transistor M14 are turned on, to pull down the potentials of the signal output terminal OUTPUT and the pull-up node PU in all shift register units in the shift register, and to reset the shift register units in all rows, which improves the stability of the circuit.

Transistors of the shift register are connected in the same way as during the forward scan and the reverse scan, except that the output level signals of the first voltage source VDS and that of the second voltage source VSD are different. For example, when the shift register performs the forward scan, the first voltage source VDS outputs a high-level signal while the second voltage source VSD outputs a low-level signal. When the shift register performs the reverse scan, the first voltage source VDS outputs a low-level signal while the second voltage source VSD outputs a high-level signal.

In an embodiment of the present disclosure, the shift register includes a first voltage source VDS, a second voltage source VSD, a third voltage source VDD and a fourth voltage source VSS. The output level signals of each voltage source are different during the forward scan and the reverse scan, for example:

The first voltage source VDS outputs a high-level signal when the shift register performs the forward scan. The first voltage source VDS outputs a low-level signal when the shift register performs the reverse scan.

The second voltage source VSD outputs a low-level signal when the shift register performs the forward scan. The second voltage source VSD outputs a high-level signal when the shift register performs the reverse scan.

The third voltage source VDD outputs a high-level signal VGH when the shift register performs the forward scan and the reverse scan.

The third voltage source VSS outputs a low-level signal VGL when the shift register performs the forward scan and the reverse scan.

In an embodiment of the present disclosure, the input sub-circuit provides the signal of the first voltage source VDS to the first node PD_DC under the control of the signal input terminal INPUT. The first reset sub-circuit provides the signal of the second voltage source VSD to the first node PD_DC under the control of the reset terminal RESET. The pull-down sub-circuit outputs the level of the fourth voltage source VSS to the pull-down node PD according to the level of the first node PD_DC. Therefore, the problem that the pull-up node PU and the pull-down node PD compete with each other during a dual scan is well solved, which improves the stability of GOA driving and the display quality of the display panel.

Some embodiments of the present disclosure also provide a driving method of a shift register applied to the shift register according to the previous embodiments. The shift register includes an input sub-circuit, a first reset sub-circuit, a pull-down sub-circuit, a pull-down control sub-circuit, an output sub-circuit and a second reset sub-circuit, as well as a signal input terminal, a clock signal terminal, a reset terminal, a first voltage source, a second voltage source, a third voltage source, a fourth voltage source and a signal output terminal. FIG. 11 is a flowchart of a driving method of a shift register during a forward scan according to an embodiment of the present disclosure. The driving method includes the following steps:

Step 100: The input sub-circuit provides the signal of the first voltage source to the pull-up node and the first node under the control of the signal input terminal. The pull-down control sub-circuit pulls down the level of the pull-down node according to the level of the pull-up node. The pull-down sub-circuit outputs the level of the fourth voltage source to the pull-down node according to the level of the first node.

In an exemplary embodiment, the first voltage source outputs a high-level signal when the shift register performs the forward scan, and the fourth voltage source outputs a low-level signal when the shift register performs both the forward and the reverse scan. In this step, the potential of the pull-down node is pulled down to prevent the potential of the pull-down node from affecting the potential of the pull-up node.

Step 200: The output sub-circuit outputs the signal from the clock signal terminal to the signal output terminal according to the level of the pull-up node.

In an exemplary embodiment, the input signal from the clock signal terminal is a pulse signal. In this step, the input signal from the clock signal terminal is at a high level, and the output signal of the signal output terminal is at a high level.

Step 300: The first reset sub-circuit provides the signal of the second voltage source to the pull-up node and the first node respectively under the control of the reset terminal. The pull-down control sub-circuit pulls up the level of the pull-down node according to the signal of the third voltage source. The pull-down sub-circuit outputs the level of the fourth voltage source to the pull-up node and the signal output terminal according to the level of the pull-down node.

In an exemplary embodiment, the second voltage source outputs a low-level signal when the shift register performs the forward scan, and the third voltage source outputs a high-level signal when the shift register performs both the forward scan and the reverse scan. The pull-down sub-circuit pulls down the levels of the pull-up node and the signal output terminal to the low-level signal of the fourth voltage source to avoid noise.

In an exemplary embodiment, the driving method further includes: when the last row of shift register units are reset, the second reset sub-circuit resets the signal output terminals and pull-up nodes of all shift register units under the control of the total reset terminal.

FIG. 12 is a flowchart of a driving method of shift register during a reverse scan according to an embodiment of the present disclosure. During the reverse scan, the driving method includes the following steps:

Step 400: The first reset sub-circuit provides the signal of the second voltage source to the pull-up node and the first node respectively under the control of the reset terminal. The pull-down control sub-circuit pulls down the level of the pull-down node according to the level of the pull-up node. The pull-down sub-circuit outputs the level of the fourth voltage source to the pull-down node according to the level of the first node.

In an exemplary embodiment, the second voltage source outputs a high-level signal when the shift register performs the reverse scan, and the fourth voltage source outputs a low-level signal when the shift register performs both the forward scan and the reverse scan. In this step, the potential of the pull-down node is pulled down to prevent the potential of the pull-down node from affecting the potential of the pull-up node.

Step 500: The output sub-circuit outputs the signal from the clock signal terminal to the signal output terminal according to the level of the pull-up node.

In an exemplary embodiment, the input signal from the clock signal terminal is a pulse signal. In this step, the input signal from the clock signal terminal is at a high level, and the output signal of the signal output terminal is at a high level.

Step 600: The input sub-circuit provides the signal of the first voltage source to the pull-up node and the first node under the control of the signal input terminal. The pull-down control sub-circuit pulls up the level of the pull-down node according to the signal of the third voltage source. The pull-down sub-circuit outputs the level of the fourth voltage source to the pull-up node and the signal output terminal according to the level of the pull-down node.

In an exemplary embodiment, the first voltage source outputs a low-level signal when the shift register performs the reverse scan, and the third voltage source outputs a high-level signal when the shift register performs both the forward scan and the reverse scan. The pull-down sub-circuit pulls down the levels of the pull-up node and the signal output terminal to the low-level signal of the fourth voltage source to avoid noise.

In an exemplary embodiment, the driving method further includes: when the last row of shift register units are reset, the second reset sub-circuit resets the signal output terminals and pull-up nodes of all shift register units under the control of the total reset terminal.

In the driving method of the shift register according to an embodiment of the present disclosure, the input sub-circuit provides the signal of the first voltage source to the first node under the control of the signal input terminal. The first reset sub-circuit provides the signal of the second voltage source to the first node under the control of the reset terminal. The pull-down sub-circuit outputs the level of the fourth voltage source to the pull-down node according to the level of the first node. Therefore, the problem that the pull-up node and the pull-down node compete with each other during dual scan is well solved, which improves the stability of GOA driving and the display quality of the display panel.

Figure 13:
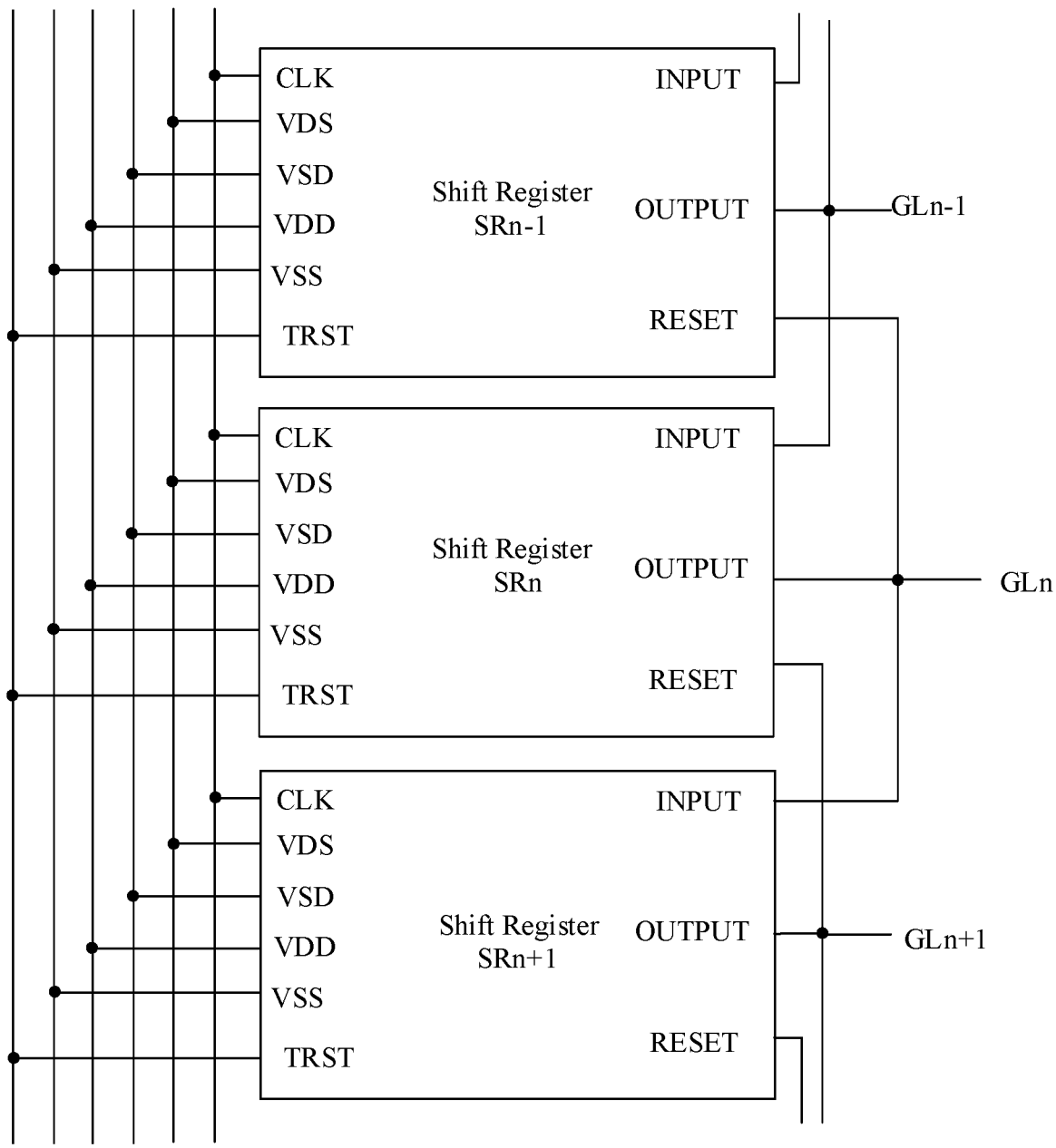
FIG. 13 is a schematic diagram of a structure of a gate driving circuit according to an embodiment of the present disclosure.

An embodiment of the present disclosure further provides a gate driving circuit. FIG. 13 is a schematic diagram of a structure of a gate driving circuit according to an embodiment of the present disclosure. As illustrated in FIG. 13, the gate driving circuit includes a plurality of cascaded shift registers, a signal output terminal of each shift register is connected with a gate line for driving the gate line.

In an exemplary embodiment, for example, when each shift register performs a forward scan, the first voltage source outputs a high-level signal while the second voltage source outputs a low-level signal, and, except that of a last stage shift register, the signal output terminal of each shift register is also connected with the signal input terminal of the next-stage shift register. A signal input terminal of a first-stage shift register needs to be connected with a separate drive signal. Meanwhile, the signal output terminal of each shift register, except that of the first-stage shift register, is further connected with a reset terminal of a previous-stage shift register. A reset terminal of the last-stage shift register is connected with a separate driving signal.

In the gate driving circuit, the levels of the clock signal terminals of the shift registers of the adjacent two stages are opposite. For example, the clock signal terminal of the shift register SR2 inputs a high-potential signal, while the clock signal terminal of the shift register SR1 and that of the shift register SR3 inputs a low-level signal. Each shift register, except the redundant register, converts the input clock signal into a turn-on or turn-off signal and outputs the signal from its signal output terminal to a corresponding gate line. For example, the shift register SR1 converts the signal received from its clock signal terminal into a turn-on or turn-off signal and outputs the signal from the its signal output terminal to a corresponding gate line GL1, and the shift register SRn converts the signal received from its clock signal terminal to a turn-on or turn-off signal and outputs the signal from its the signal output terminal to a corresponding gate line GLn.

The shift register is the shift register according to any one of the aforementioned embodiments and has similar implementation principle and implementation effect which will not be described in detail here again.

The accompanying drawings of the embodiments of the present disclosure only involve structures involved in the embodiments of the present disclosure, and other structures will be apparent with reference to general designs.

The embodiments of the present disclosure (that is, features in the embodiments) may be combined with each other to obtain new embodiments where there is no conflict.

Although the embodiments disclosed in the present disclosure are as described above, the embodiments described in the above contents are only for the present disclosure to be understood easily, not for limiting the present disclosure. Any person skilled in the art to which the present disclosure pertains may make any modifications and variations in the form and details of implementation without departing from the spirit and scope of the present disclosure. Nevertheless, the protection scope of the present disclosure shall still be determined by the scope defined by the appended claims.

What we claim is:

1. A shift register, comprising:
an input sub-circuit, a first reset sub-circuit, an output sub-circuit, a pull-down sub-circuit, a pull-down control sub-circuit and a second reset sub-circuit, wherein
the input sub-circuit is configured to, under control of a signal input terminal, provide a signal of a first voltage source to a pull-up node and a first node respectively;
the first reset sub-circuit is configured to, under control of a reset terminal, provide a signal of a second voltage source to the pull-up node and the first node respectively;
the output sub-circuit is configured to, according to a level of the pull-up node, output a signal of a clock signal terminal to a signal output terminal;
the pull-down control sub-circuit is configured to, according to the level of the pull-up node and a signal of a third voltage source, control a level of a pull-down node;
the pull-down sub-circuit is configured to, according to a level of the first node, output a level of a fourth voltage source to the pull-down node, and, according to the level of the pull-down node, output the level of the fourth voltage source to the pull-up node and the signal output terminal; and
the second reset sub-circuit is configured to, under control of a total reset terminal, reset the pull-up node and the signal output terminal.

2. The shift register according to claim 1, wherein the input sub-circuit comprises: a first transistor and a second transistor,
a control electrode of the first transistor is connected with the signal input terminal, a first electrode of the first transistor is connected with the first voltage source, and a second electrode of the first transistor is connected with the pull-up node; and a control electrode of second transistor is connected with the signal input terminal, a first electrode of the second transistor is connected with the first voltage source, and a second electrode of the second transistor is connected with the first node.

3. The shift register according to claim 1, wherein the first reset sub-circuit comprises: a third transistor and a fourth transistor, a control electrode of the third transistor is connected with the reset terminal, a first electrode of the third transistor is connected with the second voltage source, and a second electrode of the third transistor is connected with the pull-up node; and a control electrode of the fourth transistor is connected with the reset terminal, a first electrode of the fourth transistor is connected with the second voltage source, and a second electrode of the fourth transistor is connected with the first node.

4. The shift register according to claim 1, wherein the pull-down sub-circuit comprises: a fifth transistor, a sixth transistor and a seventh transistor, a control electrode of the fifth transistor is connected with the first node, a first electrode of the fifth transistor is connected with the fourth voltage source, and a second electrode of the fifth transistor is connected with the pull-down node;

a control electrode of the sixth transistor is connected with the pull-down node, a first electrode of the sixth transistor is connected with the fourth voltage source, and a second electrode of the sixth transistor is connected with the pull-up node; and a control electrode of the seventh transistor is connected with the pull-down node, a first electrode of the seventh transistor is connected with the fourth voltage source, and a second electrode of the seventh transistor is connected with the signal output terminal.

5. The shift register according to claim 1, wherein the pull-down control sub-circuit comprises: an eighth transistor, a ninth transistor, a tenth transistor and an eleventh transistor, a control electrode and a first electrode of the eighth transistor both are connected with the third voltage source, and a second electrode of the eighth transistor is connected with a second node;

a control electrode of the ninth transistor is connected with the second node, a first electrode of the ninth transistor is connected with the third voltage source, and a second electrode of the ninth transistor is connected with the pull-down node;

a control electrode of the tenth transistor is connected with the pull-up node, a first electrode of the tenth transistor is connected with the second node, and a second electrode of the tenth transistor is connected with the fourth voltage source; and a control electrode of the eleventh transistor is connected with the pull-up node, a first electrode of the eleventh transistor is connected with the pull-down node, and a second electrode of the eleventh transistor is connected with the fourth voltage source.

6. The shift register according to claim 1, wherein the output sub-circuit comprises: a twelfth transistor and a capacitor, a control electrode of the twelfth transistor is connected with the pull-up node, a first electrode of the twelfth transistor is connected with the clock signal terminal, and a second electrode of the twelfth transistor is connected with the signal output terminal; and a terminal of the capacitor is connected with the pull-up node, and the other terminal of the capacitor is connected with the signal output terminal.

7. The shift register according to claim 1, wherein the second reset sub-circuit comprises: a thirteenth transistor and a fourteenth transistor, a control electrode of the thirteenth transistor is connected with the total reset terminal, a first electrode of the thirteenth transistor is connected with the fourth voltage source, and a second electrode of the thirteenth transistor is connected with the signal output terminal; and a control electrode of the fourteenth transistor is connected with the total reset terminal, a first electrode of the fourteenth transistor is connected with the fourth voltage source, and a second electrode of the fourteenth transistor is connected with the pull-up node.

8. The shift register according to claim 1, wherein the input sub-circuit comprises: a first transistor and a second transistor, the first reset sub-circuit comprises a third transistor and a fourth transistor, the pull-down sub-circuit comprises a fifth transistor, a sixth transistor, and a seventh transistor, the pull-down control sub-circuit comprises an eighth transistor, a ninth transistor, a tenth transistor and an eleventh transistor, the output sub-circuit includes a twelfth transistor and a capacitor, and the second reset sub-circuit comprises: a thirteenth transistor and a fourteenth transistor, a control electrode of the first transistor is connected with the signal input terminal, a first electrode of the first transistor is connected with the first voltage source, and a second electrode of the first transistor is connected with the pull-up node;

a control electrode of second transistor is connected with the signal input terminal, a first electrode of the second transistor is connected with the first voltage source, and a second electrode of the second transistor is connected with the first node;

a control electrode of the third transistor is connected with the reset terminal, a first electrode of the third transistor is connected with the second voltage source, and a second electrode of the third transistor is connected with the pull-up node;

a control electrode of the fourth transistor is connected with the reset terminal, a first electrode of the fourth transistor is connected with the second voltage source, and a second electrode of the fourth transistor is connected with the first node;

a control electrode of the fifth transistor is connected with the first node, a first electrode of the fifth transistor is connected with the fourth voltage source, and a second electrode of the fifth transistor is connected with the pull-down node;

a control electrode of the sixth transistor is connected with the pull-down node, a first electrode of the sixth transistor is connected with the fourth voltage source, and a second electrode of the sixth transistor is connected with the pull-up node; and a control electrode of the seventh transistor is connected with the pull-down node, a first electrode of the seventh transistor is connected with the fourth voltage source, and a second electrode of the seventh transistor is connected with the signal output terminal;

a control electrode and a first electrode of the eighth transistor both are connected with the third voltage source, and a second electrode of the eighth transistor is connected with a second node;

a control electrode of the ninth transistor is connected with the second node, a first electrode of the ninth transistor is connected with the third voltage source, and a second electrode of the ninth transistor is connected with the pull-down node;

a control electrode of the tenth transistor is connected with the pull-up node, a first electrode of the tenth transistor is connected with the second node, and a second electrode of the tenth transistor is connected with the fourth voltage source;

a control electrode of the eleventh transistor is connected with the pull-up node, a first electrode of the eleventh transistor is connected with the pull-down node, and a second electrode of the eleventh transistor is connected with the fourth voltage source;

a control electrode of the twelfth transistor is connected with the pull-up node, a first electrode of the twelfth transistor is connected with the clock signal terminal, and a second electrode of the twelfth transistor is connected with the signal output terminal;

a terminal of the capacitor is connected with the pull-up node, and the other terminal of the capacitor is connected with the signal output terminal;

a control electrode of the thirteenth transistor is connected with the total reset terminal, a first electrode of the thirteenth transistor is connected with the fourth voltage source, and a second electrode of the thirteenth transistor is connected with the signal output terminal; and a control electrode of the fourteenth transistor is connected with the total reset terminal, a first electrode of the fourteenth transistor is connected with the fourth voltage source, and a second electrode of the fourteenth transistor is connected with the pull-up node.

9. A gate driving circuit, comprising a plurality of cascaded shift registers according to claim 1.

10. A driving method for a shift register, applied to the shift register according to claim 1, wherein during a forward scan, the driving method comprises:

providing, by the input sub-circuit, under the control of the signal input terminal, the signal of the first voltage source to the pull-up node and the first node; pulling down, by the pull-down control sub-circuit, according to the level of the pull-up node, the level of the pull-down node; outputting, by the pull-down sub-circuit, according to the level of the first node, the level of the fourth voltage source to the pull-down node;

outputting, by the output sub-circuit, according to the level of the pull-up node, the signal of the clock signal terminal to the signal output terminal; and providing, by the first reset sub-circuit, under the control of the reset terminal, the signal of the second voltage source to the pull-up node and the first node respectively; pulling up, by the pull-down control sub-circuit, according to the signal of the third voltage source, the level of the pull-down node; outputting, by the pull-down sub-circuit, according to the level of the pull-down node, the level of the fourth voltage source to the pull-up node and the signal output terminal.

11. The driving method according to claim 10, wherein during a reverse scan, the driving method comprises:

providing, by the first reset sub-circuit, under the control of the reset terminal, the signal of the second voltage source to the pull-up node and the first node respectively; pulling down, by the pull-down control sub-circuit, according to the level of the pull-up node, the level of the pull-down node; outputting, by the pull-down sub-circuit, according to the level of the first node, the level of the fourth voltage source to the pull-down node;

outputting, by the output sub-circuit, according to the level of the pull-up node, the signal of the clock signal terminal to the signal output terminal; and providing, by the input sub-circuit, under the control of the signal input terminal, the signal of the first voltage source to the pull-up node and the first node respectively; pulling up, by the pull-down control sub-circuit, according to the signal of the third voltage source, the level of the pull-down node; outputting, by the pull-down sub-circuit, according to the level of the pull-down node, the level of the fourth voltage source to the pull-up node and the signal output terminal.

* * * * *